United States Patent
Suthiwongsunthorn et al.

(10) Patent No.: US 9,054,083 B2
(45) Date of Patent: *Jun. 9, 2015

(54) SEMICONDUCTOR DEVICE AND METHOD OF MAKING TSV INTERCONNECT STRUCTURES USING ENCAPSULANT FOR STRUCTURAL SUPPORT

(71) Applicant: STATS ChipPAC, Ltd., Singapore (SG)

(72) Inventors: Nathapong Suthiwongsunthorn, Singapore (SG); Pandi C. Marimuthu, Singapore (SG); Jae Hun Ku, Singapore (SG); Glenn Omandam, Singapore (SG); Hin Hwa Goh, Singapore (SG); Kock Liang Heng, Singapore (SG); Jose A. Caparas, Singapore (SG)

(73) Assignee: STATS ChipPAC, Ltd., Singapore (SG)

( * ) Notice: Subject to any disclaimer, the term of this patent is extended or adjusted under 35 U.S.C. 154(b) by 0 days.

This patent is subject to a terminal disclaimer.

(21) Appl. No.: 14/143,891

(22) Filed: Dec. 30, 2013

(65) Prior Publication Data

US 2014/0110861 A1 Apr. 24, 2014

Related U.S. Application Data

(60) Continuation of application No. 13/245,099, filed on Sep. 26, 2011, now Pat. No. 8,659,162, which is a division of application No. 12/480,317, filed on Jun. 8, 2009, now Pat. No. 8,067,308.

(51) Int. Cl.
*H01L 21/311* (2006.01)
*H01L 21/48* (2006.01)
(Continued)

(52) U.S. Cl.
CPC ............ *H01L 21/486* (2013.01); *H01L 21/561* (2013.01); *H01L 21/76898* (2013.01); *H01L 23/3128* (2013.01); *H01L 23/481* (2013.01); *H01L 24/03* (2013.01); *H01L 24/05* (2013.01);
(Continued)

(58) Field of Classification Search
USPC .......... 438/700, 618, 270, 127, 680; 257/396, 257/774, E21.006, E21.051, E21.17, 257/E21.352, E21.449, E21.502, E21.508
See application file for complete search history.

(56) References Cited

U.S. PATENT DOCUMENTS

| | | | |
|---|---|---|---|
| 6,002,169 A | 12/1999 | Chia et al. | |
| 7,741,148 B1 * | 6/2010 | Marimuthu et al. | 438/106 |

(Continued)

FOREIGN PATENT DOCUMENTS

TW 200901411 A 1/2009

*Primary Examiner* — David Nhu
(74) *Attorney, Agent, or Firm* — Robert D. Atkins; Atkins and Associates, P.C.

(57) ABSTRACT

A semiconductor device includes a substrate and a via extending through the substrate. A first insulating layer is disposed on sidewalls of the via. An electrically conductive material is disposed in the via over the first insulating layer to form a TSV. A first interconnect structure is disposed over a first side of the substrate. A semiconductor die or a component is mounted to the first interconnect structure. An encapsulant is disposed over the first interconnect structure and semiconductor die or component. A second interconnect structure is disposed over the second side of the substrate. The second interconnect structure is electrically connected to the TSV. The second interconnect structure includes a second insulating layer disposed over the second surface of the substrate and TSV, and a first conductive layer disposed over the TSV and in contact with the TSV through the second insulating layer.

25 Claims, 10 Drawing Sheets

(51) Int. Cl.
  *H01L 21/56* (2006.01)
  *H01L 21/768* (2006.01)
  *H01L 23/31* (2006.01)
  *H01L 23/48* (2006.01)
  *H01L 23/00* (2006.01)
  *H01L 23/498* (2006.01)

(52) U.S. Cl.
  CPC ................ H01L 24/11 (2013.01); *H01L 24/13* (2013.01); *H01L 24/16* (2013.01); H01L 24/92 (2013.01); H01L 24/94 (2013.01); H01L 24/95 (2013.01); *H01L 2224/0401* (2013.01); *H01L 2224/05611* (2013.01); *H01L 2224/05624* (2013.01); *H01L 2224/05639* (2013.01); *H01L 2224/05644* (2013.01); *H01L 2224/05647* (2013.01); *H01L 2224/05655* (2013.01); *H01L 2224/13022* (2013.01); *H01L 2224/13025* (2013.01); *H01L 2224/13099* (2013.01); *H01L 2224/48091* (2013.01); *H01L 2224/48247* (2013.01); *H01L 2224/73265* (2013.01); *H01L 2224/85399* (2013.01); *H01L 2224/94* (2013.01); *H01L 2924/01004* (2013.01); *H01L 2924/01013* (2013.01); *H01L 2924/01014* (2013.01); *H01L 2924/01022* (2013.01); *H01L 2924/01029* (2013.01); *H01L 2924/01032* (2013.01); *H01L 2924/01046* (2013.01); *H01L 2924/01047* (2013.01); *H01L 2924/01049* (2013.01); *H01L 2924/0105* (2013.01); *H01L 2924/01073* (2013.01); *H01L 2924/01074* (2013.01); *H01L 2924/01078* (2013.01); *H01L 2924/01079* (2013.01); *H01L 2924/01082* (2013.01); *H01L 2924/01322* (2013.01); *H01L 2924/014* (2013.01); *H01L 2924/04941* (2013.01); *H01L 2924/09701* (2013.01); *H01L 2924/13091* (2013.01); *H01L 2924/14* (2013.01); *H01L 2924/1433* (2013.01); *H01L 2924/15174* (2013.01); *H01L 2924/15184* (2013.01); *H01L 2924/15311* (2013.01); *H01L 2924/19041* (2013.01); *H01L 2924/19042* (2013.01); *H01L 2924/19043* (2013.01); *H01L 2924/19105* (2013.01); *H01L 2924/30105* (2013.01); *H01L 2924/0132* (2013.01); H01L 24/29 (2013.01); *H01L 24/48* (2013.01); *H01L 2224/83805* (2013.01); *H01L 2924/01006* (2013.01); *H01L 2924/01023* (2013.01); *H01L 2924/01024* (2013.01); *H01L 2224/16225* (2013.01); *H01L 2224/29111* (2013.01); *H01L 2224/2919* (2013.01); *H01L 2924/1579* (2013.01); *H01L 2224/131* (2013.01); *H01L 2924/0001* (2013.01); H01L 21/563 (2013.01); H01L 23/49827 (2013.01); *H01L 2924/12041* (2013.01); *H01L 2924/1306* (2013.01); *H01L 2224/16235* (2013.01)

(56) References Cited

U.S. PATENT DOCUMENTS

| | | | | |
|---|---|---|---|---|
| 7,993,941 | B2 * | 8/2011 | Huang et al. | 438/15 |
| 8,067,308 | B2 * | 11/2011 | Suthiwongsunthorn et al. | 438/618 |
| 8,659,162 | B2 * | 2/2014 | Suthiwongsunthorn et al. | 257/774 |
| 8,722,457 | B2 * | 5/2014 | Camacho et al. | 438/107 |
| 2005/0189636 | A1 | 9/2005 | Savastiouk et al. | |
| 2008/0315372 | A1 | 12/2008 | Kuan et al. | |
| 2009/0166825 | A1 | 7/2009 | Camacho et al. | |
| 2009/0243083 | A1 | 10/2009 | Han et al. | |
| 2010/0140736 | A1 | 6/2010 | Lin et al. | |
| 2010/0140751 | A1 | 6/2010 | Tay et al. | |
| 2010/0140815 | A1 | 6/2010 | Marimuthu et al. | |

* cited by examiner

SEMICONDUCTOR DEVICE AND METHOD OF MAKING TSV INTERCONNECT STRUCTURES USING ENCAPSULANT FOR STRUCTURAL SUPPORT

CLAIM TO DOMESTIC PRIORITY

The present application is a continuation of U.S. patent application Ser. No. 13/245,099, now U.S. Pat. No. 8,659, 162, filed Sep. 26, 2011, which is a division of U.S. patent application Ser. No. 12/480,317, now U.S. Pat. No. 8,067, 308, filed Jun. 8, 2009, which applications are incorporated herein by reference.

FIELD OF THE INVENTION

The present invention relates in general to semiconductor devices and, more particularly, to a semiconductor device and method of forming an interconnect structure with a through silicon via using an encapsulant for structural support.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The atomic structure of semiconductor material allows its electrical conductivity to be manipulated by the application of an electric field or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed calculations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each die is typically identical and contains circuits formed by electrically connecting active and passive components. Back-end manufacturing involves singulating individual die from the finished wafer and packaging the die to provide structural support and environmental isolation.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller die size may be achieved by improvements in the front-end process resulting in die with smaller, higher density active and passive components. Back-end processes may result in semiconductor device packages with a smaller footprint by improvements in electrical interconnection and packaging materials.

The electrical interconnection between the semiconductor package containing semiconductor devices on multiple levels (3-D device integration) and an external printed circuit board (PCB) or substrate is typically accomplished with wire bonds, through hole vias (THV), or through silicon vias (TSV). Wire bonds require additional package area to form the bend in the leads. To make electrical interconnect using THVs or TSVs, a temporary carrier is bonded to the package substrate for structural support while forming the THVs and TSVs. For thin wafers, e.g., less than 250 micrometers (μm), excessive handling can lead to breakage and slippage. The temporary carrier adds manufacturing costs. The bonding material for the temporary carrier limits processing temperatures to about 200° C.

SUMMARY OF THE INVENTION

In one embodiment, the present invention is a method of making a semiconductor device comprising the steps of providing a substrate, forming a conductive via partially through the substrate, forming an interconnect structure over a surface of the substrate, disposing a semiconductor component over the interconnect structure, and depositing an encapsulant over the interconnect structure and the semiconductor component.

In another embodiment, the present invention is a method of making a semiconductor device comprising the steps of providing a substrate, forming a conductive via through the substrate, forming an interconnect structure over the substrate, disposing a semiconductor die over the interconnect structure, and depositing an encapsulant over the semiconductor die.

In another embodiment, the present invention is a method of making a semiconductor device comprising the steps of providing a substrate, forming a conductive via through the substrate, disposing a semiconductor die over the conductive via, and depositing an encapsulant over the semiconductor die.

In another embodiment, the present invention is a semiconductor device comprising a substrate and a conductive via formed through the substrate. A semiconductor die is disposed over the conductive via. An encapsulant is deposited over the semiconductor die.

DETAILED DESCRIPTION OF THE DRAWINGS

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, resistors, and transformers, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into an insulator, conductor, or dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition may involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. The portion of the photoresist pattern subjected to light is removed using a solvent, exposing portions of the underlying layer to be patterned. The remainder of the photoresist is removed, leaving behind a patterned layer. Alternatively, some types of materials are patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface is required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual die and then packaging the die for structural support and environmental isolation. To singulate the die, the wafer is scored and broken along non-functional regions of the wafer called saw streets or scribes. The wafer is singulated using a laser cutting tool or saw blade. After singulation, the individual die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

Figure 1:
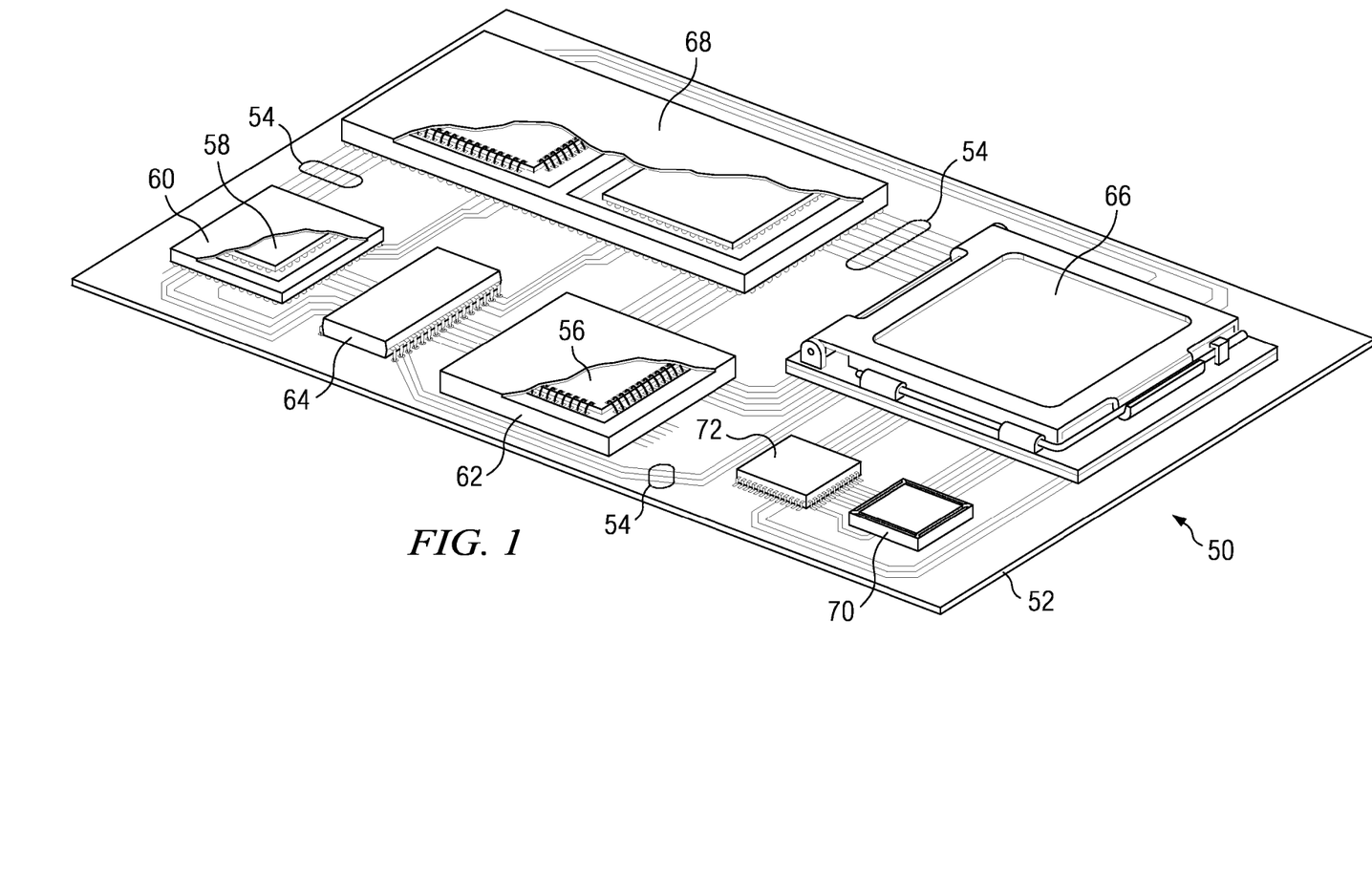
FIG. 1 illustrates a PCB with different types of packages mounted to its surface.

FIG. 1 illustrates electronic device 50 having a chip carrier substrate or PCB 52 with a plurality of semiconductor packages mounted on its surface. Electronic device 50 may have one type of semiconductor package, or multiple types of semiconductor packages, depending on the application. The different types of semiconductor packages are shown in FIG. 1 for purposes of illustration.

Electronic device 50 may be a stand-alone system that uses the semiconductor packages to perform one or more electrical functions. Alternatively, electronic device 50 may be a subcomponent of a larger system. For example, electronic device 50 may be a graphics card, network interface card, or other signal processing card that can be inserted into a computer. The semiconductor package can include microprocessors, memories, application specific integrated circuits (ASICs), logic circuits, analog circuits, RF circuits, discrete devices, or other semiconductor die or electrical components.

In FIG. 1, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate carrier. Second level packaging involves mechanically and electrically attaching the intermediate carrier to the PCB. In other embodiments, a semiconductor device may only have the first level packaging where the die is mechanically and electrically mounted directly to the PCB.

For the purpose of illustration, several types of first level packaging, including wire bond package 56 and flip chip 58, are shown on PCB 52. Additionally, several types of second level packaging, including ball grid array (BGA) 60, bump chip carrier (BCC) 62, dual in-line package (DIP) 64, land grid array (LGA) 66, multi-chip module (MCM) 68, quad flat non-leaded package (QFN) 70, and quad flat package 72, are shown mounted on PCB 52. Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using cheaper components and a streamlined manufacturing process. The resulting devices are less likely to fail and less expensive to manufacture resulting in a lower cost for consumers.

Figure 2A:
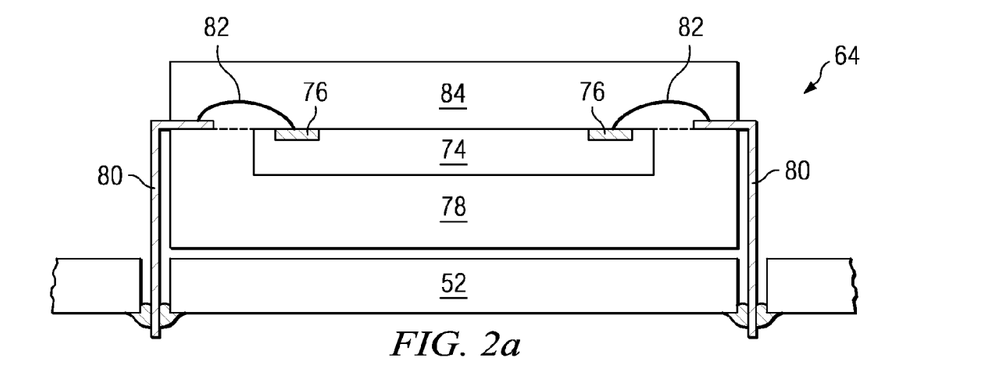
FIGS. 2a-2c illustrate further detail of the representative semiconductor packages mounted to the PCB.
Figure 2B:
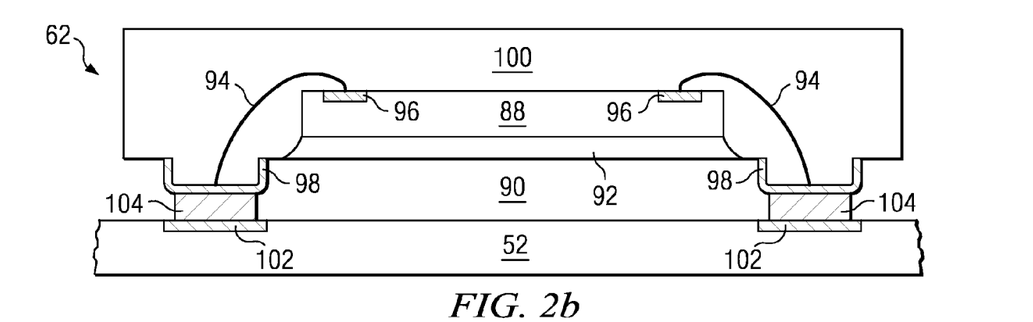
Figure 2C:
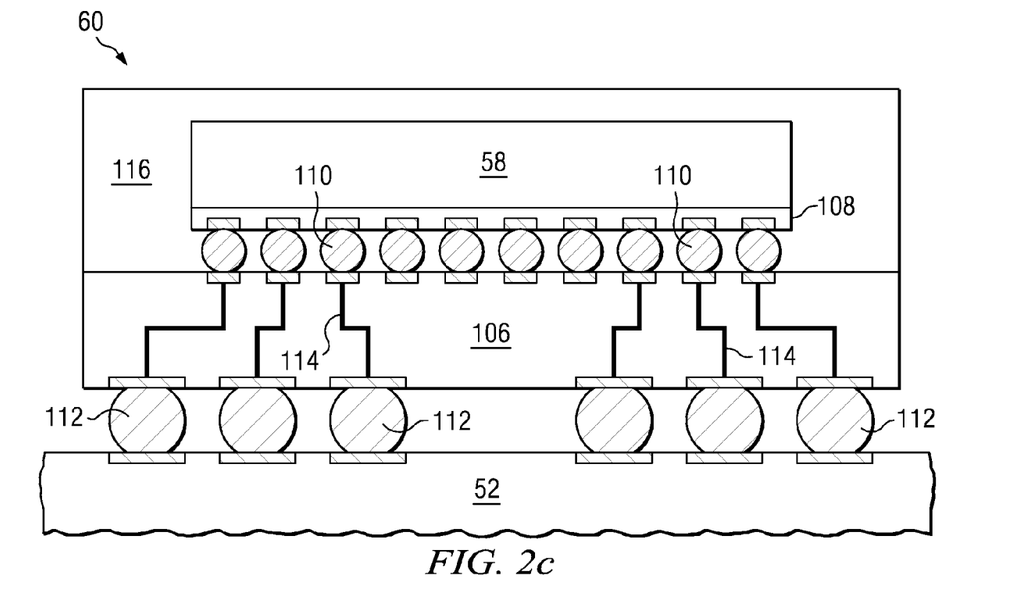

FIGS. 2a-2c show exemplary semiconductor packages. FIG. 2a illustrates further detail of DIP 64 mounted on PCB 52. Semiconductor die 74 includes an active region containing analog or digital circuits implemented as active devices, passive devices, conductive layers, and dielectric layers formed within the die and are electrically interconnected according to the electrical design of the die. For example, the circuit may include one or more transistors, diodes, inductors, capacitors, resistors, and other circuit elements formed within the active region of semiconductor die 74. Contact pads 76 are one or more layers of conductive material, such as aluminum (Al), copper (Cu), tin (Sn), nickel (Ni), gold (Au), or silver (Ag), and are electrically connected to the circuit elements formed within semiconductor die 74. During assembly of DIP 64, semiconductor die 74 is mounted to an intermediate carrier 78 using a gold-silicon eutectic layer or adhesive material such as thermal epoxy. The package body includes an insulative packaging material such as polymer or ceramic. Conductor leads 80 and wire bonds 82 provide electrical interconnect between semiconductor die 74 and PCB 52. Encapsulant 84 is deposited over the package for environmental protection by preventing moisture and particles from entering the package and contaminating die 74 or wire bonds 82.

FIG. 2b illustrates further detail of BCC 62 mounted on PCB 52. Semiconductor die 88 is mounted over carrier 90 using an underfill or epoxy-resin adhesive material 92. Wire bonds 94 provide first level packing interconnect between contact pads 96 and 98. Molding compound or encapsulant 100 is deposited over semiconductor die 88 and wire bonds 94 to provide physical support and electrical isolation for the device. Contact pads 102 are formed over a surface of PCB 52 using a suitable metal deposition such electrolytic plating or electroless plating to prevent oxidation. Contact pads 102 are electrically connected to one or more conductive signal traces 54 in PCB 52. Bumps 104 are formed between contact pads 98 of BCC 62 and contact pads 102 of PCB 52.

In FIG. 2c, semiconductor die 58 is mounted face down to intermediate carrier 106 with a flip chip style first level packaging. Active region 108 of semiconductor die 58 contains analog or digital circuits implemented as active devices, passive devices, conductive layers, and dielectric layers formed according to the electrical design of the die. For example, the circuit may include one or more transistors, diodes, inductors, capacitors, resistors, and other circuit elements within active region 108. Semiconductor die 58 is electrically and mechanically connected to carrier 106 through bumps 110.

BGA 60 is electrically and mechanically connected to PCB 52 with a BGA style second level packaging using bumps 112. Semiconductor die 58 is electrically connected to conductive signal traces 54 in PCB 52 through bumps 110, signal lines 114, and bumps 112. A molding compound or encapsulant 116 is deposited over semiconductor die 58 and carrier 106 to provide physical support and electrical isolation for the device. The flip chip semiconductor device provides a short electrical conduction path from the active devices on semiconductor die 58 to conduction tracks on PCB 52 in order to reduce signal propagation distance, lower capacitance, and improve overall circuit performance. In another embodiment, the semiconductor die 58 can be mechanically and electrically connected directly to PCB 52 using flip chip style first level packaging without intermediate carrier 106.

Figure 3A:
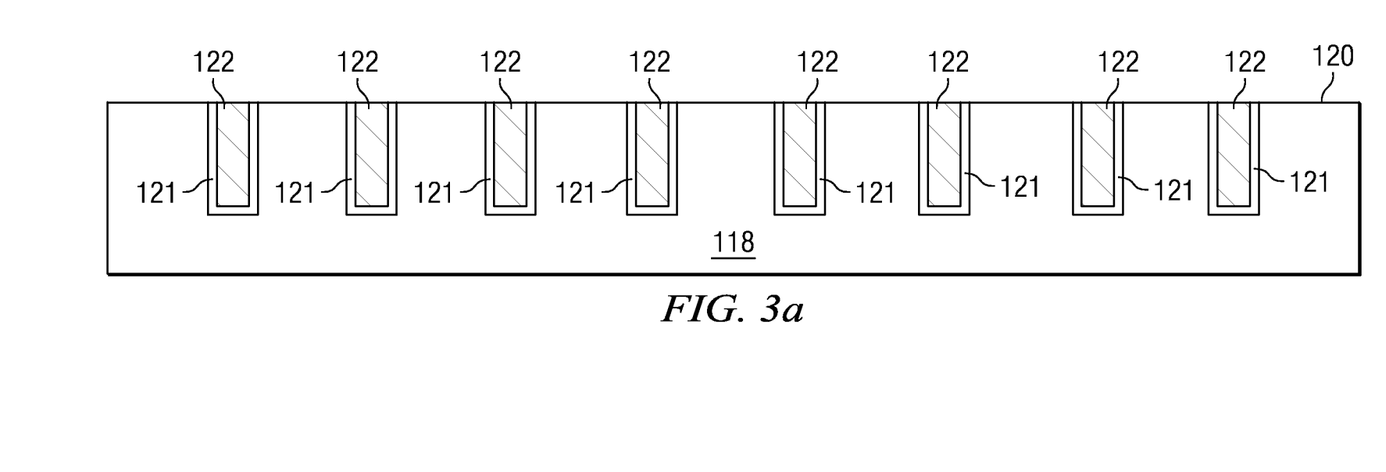
FIGS. 3a-3h illustrate a method of forming an interconnect structure with TSV for 3-D devices using an encapsulant for structural support.

FIGS. 3a-3h illustrate a process of forming an interconnect structure with a conductive via for 3-D devices using an encapsulant for structural support. In FIG. 3a, a semiconductor wafer 118 contains a substrate made with a base material such as silicon, polymer, polymer composite, metal, ceramic, glass, glass epoxy, beryllium oxide, or other suitable low-cost, rigid material for structural support. Alternatively, the substrate can be a semiconductor base material such as germanium, gallium arsenide, indium phosphide, or silicon carbide. A plurality of semiconductor die can be formed on the substrate using semiconductor manufacturing processes such as described above. Each semiconductor die includes an active region 120 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 120 to implement baseband analog circuits or digital circuits, such as digital signal processor (DSP), ASIC, memory, or other signal processing circuit. The semiconductor die may also contain integrated passive devices (IPD), such as inductors, capacitors, and resistors, for radio frequency (RF) signal processing.

The IPDs contained within semiconductor wafer 118 provide the electrical characteristics needed for high frequency applications, such as resonators, high-pass filters, low-pass filters, band-pass filters, symmetric Hi-Q resonant transformers, matching networks, and tuning capacitors. The IPDs can be used as front-end wireless RF components, which can be positioned between the antenna and transceiver. The inductor can be a hi-Q balun, transformer, or coil, operating up to 100 Gigahertz. In some applications, multiple baluns are formed on a same substrate, allowing multi-band operation. For example, two or more baluns are used in a quad-band for mobile phones or other global system for mobile (GSM) communications, each balun dedicated for a frequency band of operation of the quad-band device. A typical RF system requires multiple IPDs and other high frequency circuits in one or more semiconductor packages to perform the necessary electrical functions.

A plurality of vias is formed in semiconductor wafer 118 using laser drilling or etching process, such as deep reactive ion etching (DRIE). An insulating layer 121 is formed to line the sidewalls and bottom of the vias. The insulating layer 121 can be one or more layers of silicon dioxide (SiO2), silicon nitride (Si3N4), silicon oxynitride (SiON), tantalum pentoxide (Ta2O5), aluminum oxide (Al2O3), polyimide, benzocyclobutene (BCB), polybenzoxazoles (PBO), or other suitable dielectric material. The insulating layer 121 is formed using PVD, CVD, or thermal oxidation.

An electrically conductive material 122 is deposited in the vias over insulating layer 121 using PVD, CVD, sputtering, electrolytic plating, electroless plating process, or other suitable metal deposition process. Conductive material 122 can be one or more layers of Al, Cu, Sn, Ni, Au, Ag, W, polysilicon, or other suitable electrically conductive material. Conductive material 122 in the vias functions as conductive TSV.

Figure 3B:
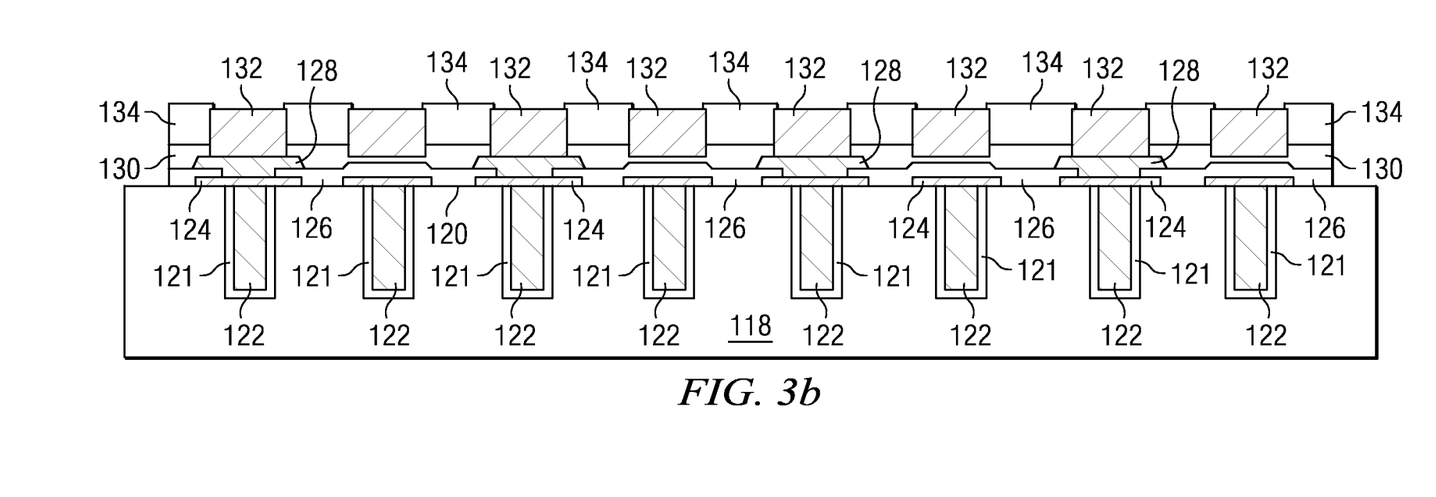

In FIG. 3b, an electrically conductive layer 124 is formed over TSVs 122 and semiconductor wafer 118 using PVD, CVD, sputtering, electrolytic plating, electroless plating process, or other suitable metal deposition process. Conductive layer 124 can be one or more layers of Al, Cu, Sn, Ni, Au, Ag, or other suitable electrically conductive material. The individual portions of conductive layer 124 can be electrically common or electrically isolated depending on the function of the semiconductor device.

An insulating or passivation layer 126 is formed on conductive layer 124 and active surface 120 of semiconductor wafer 118. The insulating layer 126 can be one or more layers of SiO2, Si3N4, SiON, Ta2O5, Al2O3, or other material having similar insulating properties. The insulating layer 126 is formed using PVD, CVD, printing, spin coating, spray coating, sintering, or thermal oxidation. A portion of insulating layer 126 is removed by an etching process to expose conductive layer 124.

An electrically conductive layer 128 is formed over conductive layer 124 and insulating layer 126 using PVD, CVD, sputtering, electrolytic plating, electroless plating process, or other suitable metal deposition process. Conductive layer 128 can be one or more layers of Al, Cu, Sn, Ni, Au, Ag, or other suitable electrically conductive material. The individual portions of conductive layer 128 can be electrically common or electrically isolated depending on the function of the semiconductor device.

An insulating or passivation layer 130 is formed on conductive layer 128 and insulating layer 126. The insulating layer 130 can be one or more layers of SiO2, Si3N4, SiON, Ta2O5, Al2O3, or other material having similar insulating properties. The insulating layer 130 is formed using PVD, CVD, printing, spin coating, spray coating, sintering, or thermal oxidation. A portion of insulating layer 130 is removed by plasma or chemical etching process to expose conductive layer 128.

Conductive pillars or posts 132 are formed over conductive layer 128. Conductive pillars 132 can be Cu, Al, W, Au, solder, or other suitable electrically conductive material. In one embodiment, the conductive pillars 132 can be Cu and formed by a plating process. A thick layer of photoresist is deposited over insulating layer 130 and conductive layer 128. The photoresist can be a liquid or a dry film with a thickness of 15 to 130 µm. Two layers of photoresist may be applied to achieve the desired thickness. In one embodiment, conductive pillars have a height of 2-120 µm. The photoresist is patterned using photolithography. Cu is deposited in the patterned areas of the photoresist using electrolytic plating. The photoresist is stripped away leaving behind individual conductive pillars 132. In another embodiment, solder balls or stud bumps can be formed over conductive layer 128.

An insulating or passivation layer 134 is formed around conductive pillars 132. The insulating layer 134 can be one or more layers of SiO2, Si3N4, SiON, Ta2O5, Al2O3, or other material having similar insulating properties. The insulating layer 134 is formed using PVD, CVD, printing, spin coating, spray coating, sintering, or thermal oxidation. A portion of insulating layer 134 is removed by an etching process to expose conductive pillar 132.

Figure 3C:
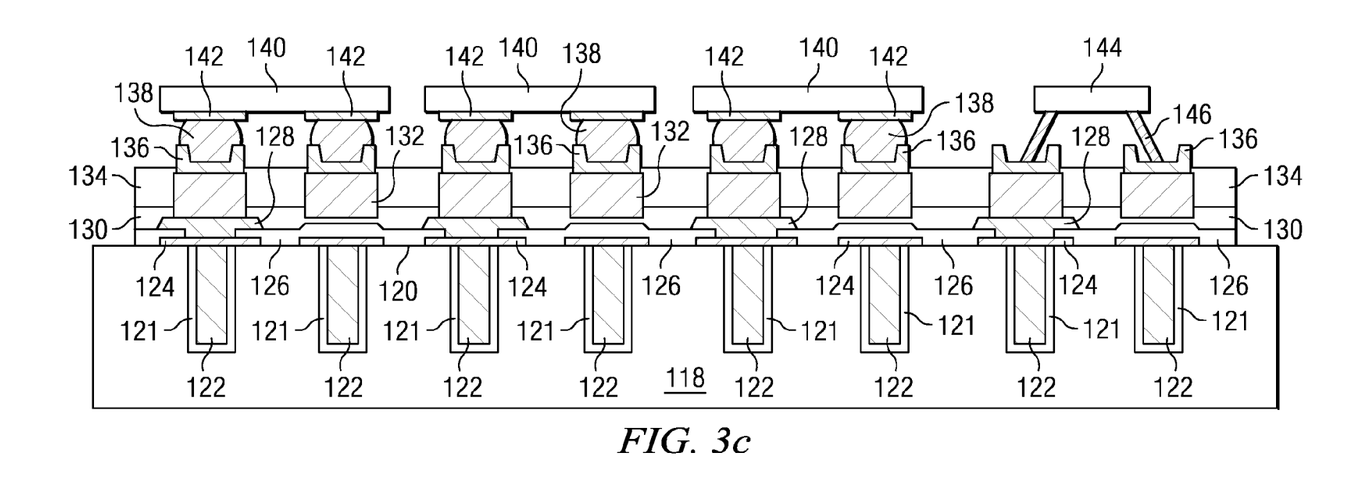

In FIG. 3c, an electrically conductive layer 136 is formed over conductive pillars 132 using PVD, CVD, sputtering, electrolytic plating, electroless plating process, or other suitable metal deposition process. Conductive layer 136 can be one or more layers of Al, Cu, Sn, Ni, Au, Ag, or other suitable electrically conductive material. Conductive layer 136 is an under bump metallization (UBM) in electrical contact with conductive pillar 132. UBM 136 can be a multi-metal stack with adhesion layer, barrier layer, and seed or wetting layer. The adhesion layer is formed over conductive pillar 132 and can be Ti, titanium nitride (TiN), titanium tungsten (TiW), Al, or chromium (Cr). The barrier layer is formed over the adhesion layer and can be made of Ni, nickel vanadium (NiV), platinum (Pt), palladium (Pd), TiW, or chromium copper (CrCu). The barrier layer inhibits the diffusion of Cu into the active area of the die. The seed layer can be Cu, Ni, NiV, Au, or Al. The seed layer is formed over the barrier layer and acts as an intermediate conductive layer between conductive pillar 132 and subsequent bumps or other interconnect structure. UBM 136 provides a low resistive interconnect to conductive pillar 132, as well as a barrier to solder diffusion and seed layer for solder wettability.

An electrically conductive material is deposited over UBM 136 using an evaporation, electrolytic plating, electroless plating, ball drop, or screen printing process. The conductive material can be Al, Sn, Ni, Au, Ag, Pb, Bi, Cu, solder, and combinations thereof, with an optional flux material. For example, the conductive material can be eutectic Sn/Pb, high-lead solder, or lead-free solder. The conductive material is bonded to UBM 136 using a suitable attachment or bonding process. In one embodiment, the conductive material is reflowed by heating the material above its melting point to form spherical balls or bumps 138. In some applications, bumps 138 are reflowed a second time to improve electrical contact to UBM 136. The bumps can also be compression bonded to UBM 136. Bumps 138 represent one type of interconnect structure that can be formed over UBM 136. The interconnect structure can also use bond wires, conductive paste, stud bump, micro bump, or other electrical interconnect.

Semiconductor die 140 each have contact pads 142 metallurgically and electrically connected to bumps 138. Each semiconductor die 140 includes a substrate with an active region containing analog or digital circuits implemented as active devices, passive devices, conductive layers, and dielectric layers formed within the die and electrically interconnected according to the electrical design and function of the die. The semiconductor die may also contain IPD for RF signal processing. A passive device or component 144 is structurally and electrically connected to UBM 136 using bonds 146. Semiconductor die 140 and passive device 144, in combination with the IPD formed in active region 120, provide a 3-D semiconductor structure.

Figure 3D:
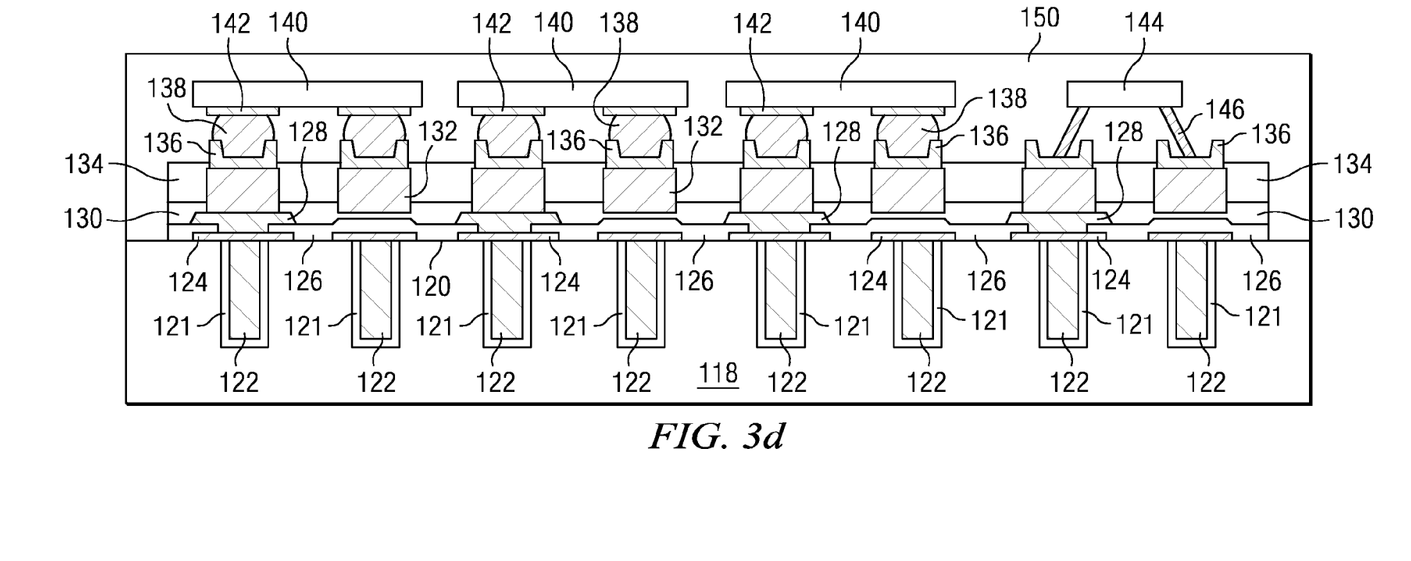

The semiconductor device is encapsulated to protect the device and provide robust structural support during formation of additional interconnect structures. FIG. 3d shows an encapsulant or molding compound 150 deposited over the structure described in FIG. 3c using a paste printing, compressive molding, transfer molding, liquid encapsulant molding, or other suitable applicator. Encapsulant 150 can be epoxy resin, epoxy acrylate, polymer, or polymer composite material. Encapsulant 150 is non-conductive and environmentally protects the semiconductor device from external elements and contaminants.

Figure 3E:
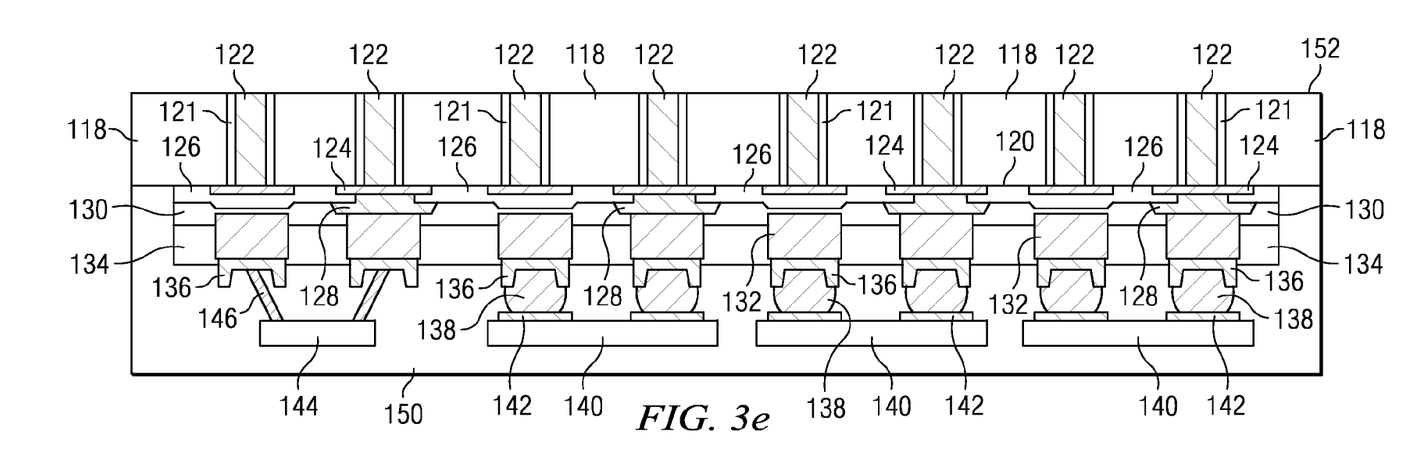

In FIG. 3e, semiconductor wafer 118 is inverted and back surface 152 is reduced in thickness by mechanical grinding, CMP, wet etching, dry etching, plasma etching, or another thinning process. Since semiconductor wafer 118 is covered with encapsulant 150, the structure is sufficiently robust to reduce substrate thickness to less than 300 μm. In one embodiment, the thickness of the substrate is reduced to 10-50 μm. A temporary carrier or tape is not needed because encapsulant 150 provides the support to maintain the structural integrity of the device, even with the reduced substrate thickness.

Figure 3F:
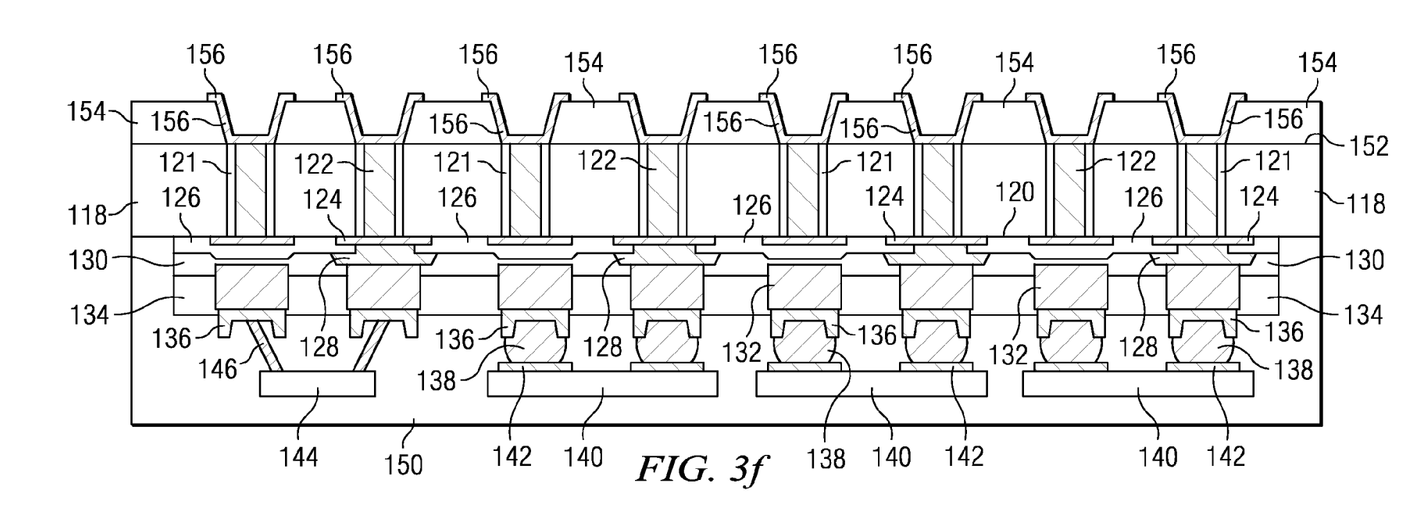

In FIG. 3f, an insulating or passivation layer 154 is formed over back surface 152 and TSVs 122. The insulating layer 154 can be one or more layers of SiO2, Si3N4, SiON, Ta2O5, Al2O3, or other material having similar insulating properties. The insulating layer 154 is formed using PVD, CVD, printing, spin coating, spray coating, sintering, or thermal oxidation. A portion of insulating layer 154 is removed by an etching process to expose TSVs 122.

An electrically conductive layer 156 is formed over TSVs 122 and insulating layer 154 using PVD, CVD, sputtering, electrolytic plating, electroless plating process, or other suitable metal deposition process. Conductive layer 156 can be one or more layers of Al, Cu, Sn, Ni, Au, Ag, or other suitable electrically conductive material. Conductive layer 156 is a UBM in electrical contact with TSVs 122.

Figure 3G:
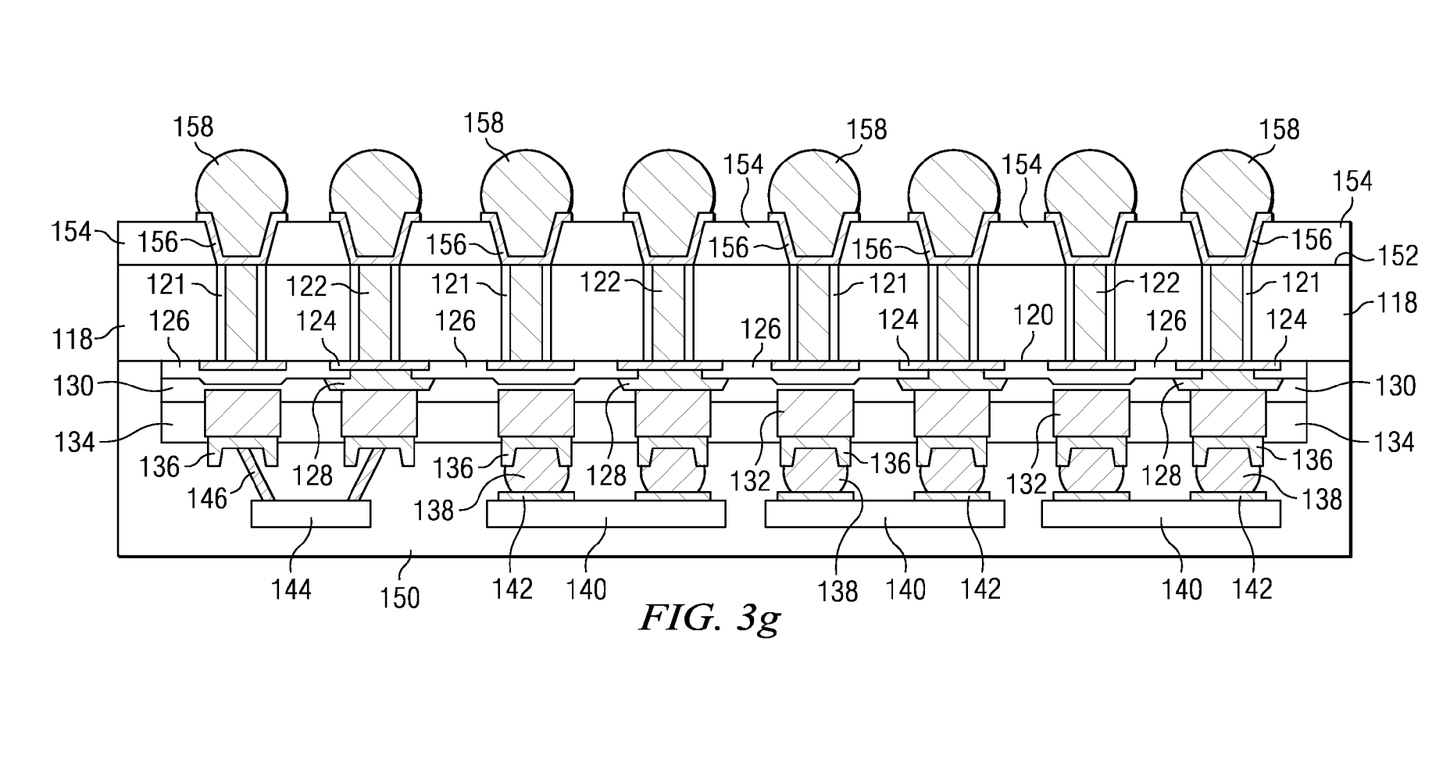

In FIG. 3g, an electrically conductive material is deposited over UBM 156 using an evaporation, electrolytic plating, electroless plating, ball drop, or screen printing process. The conductive material can be Al, Sn, Ni, Au, Ag, Pb, Bi, Cu, solder, and combinations thereof, with an optional flux material. For example, the conductive material can be eutectic Sn/Pb, high-lead solder, or lead-free solder. The conductive material is bonded to UBM 156 using a suitable attachment or bonding process. In one embodiment, the conductive material is reflowed by heating the material above its melting point to form spherical balls or bumps 158. In some applications, bumps 158 are reflowed a second time to improve electrical contact to UBM 156. The bumps can also be compression bonded to UBM 156. Bumps 158 represent one type of interconnect structure that can be formed over UBM 156. The interconnect structure can also use bond wires, conductive paste, stud bump, micro bump, or other electrical interconnect.

Figure 3H:
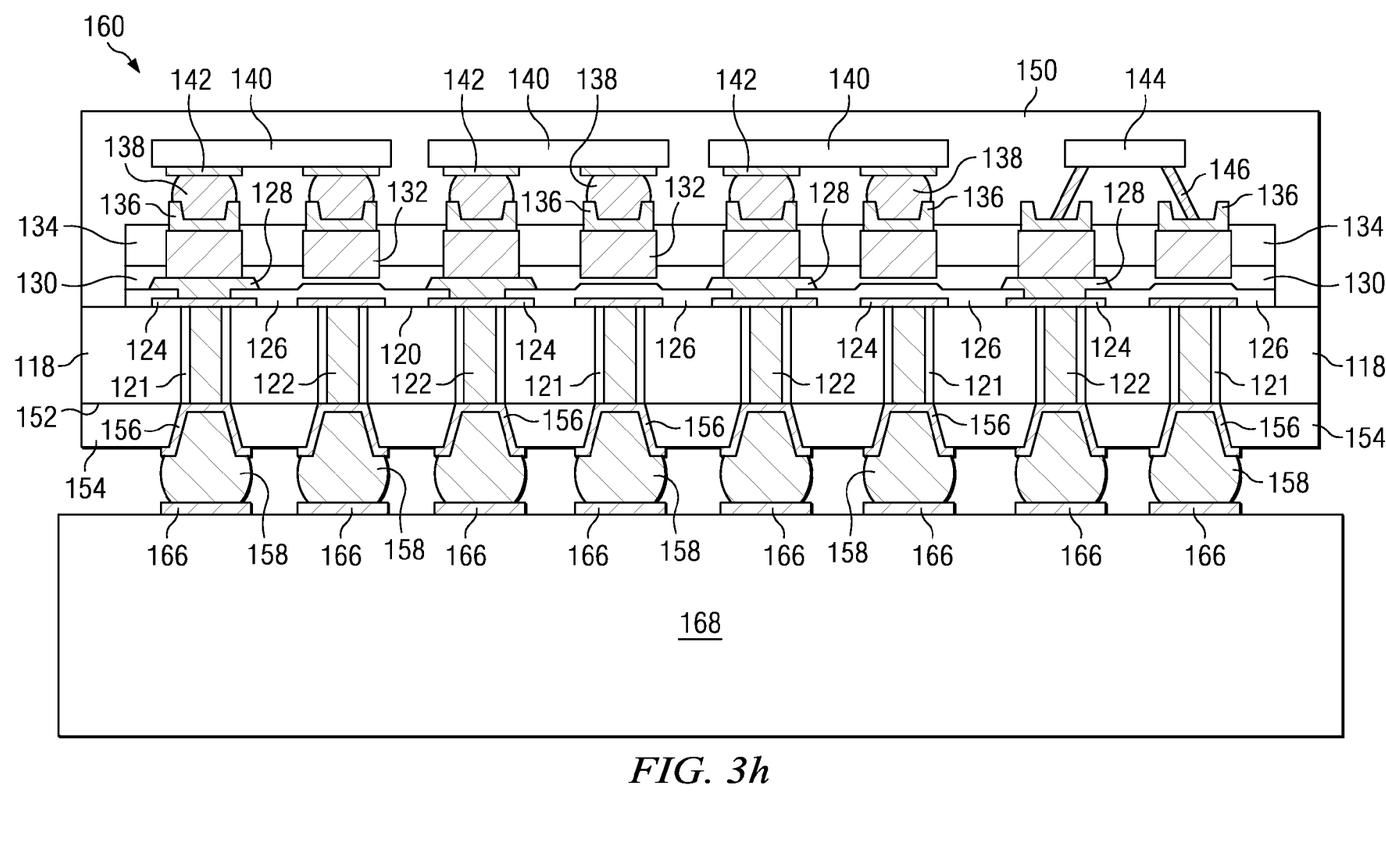

In FIG. 3h, semiconductor wafer 118 is inverted again and singulated into semiconductor devices 160, which are metallurgically and electrically connected to contact pads 166 on PCB 168 using bumps 158. Semiconductor die 140 and passive device 144, as well as passive and active devices in active region 120, electrically connect to PCB 168 through bumps 138 and 158, UBMs 136 and 156, TSV 122, conductive pillars 132, bonds 146, and conductive layers 124 and 128.

The encapsulation process makes the substrate or wafer structurally robust during formation of additional interconnect structures. The encapsulant permits backside grinding to substantially reduce its thickness. The electrical connection to PCB 168 is made on the backside of the wafer with TSVs 122 thus reducing the silicon area and package size and increasing device performance. The encapsulant eliminates the need for bonding & de-bonding to a temporary carrier, lowers manufacturing cost, reduces breakage and slip, simplifies handling, and enables higher processing temperatures. The electrical connection to the PCB on the backside of the substrate reduces silicon area and corresponding package size and thickness.

Another embodiment of forming an interconnect structure for 3-D devices using the process flow of FIGS. 3a-3d. At this point, TSVs 122, conductive layers 124 and 128, UBM 136, conductive pillars 132, bumps 138, semiconductor die 140, passive device 144, bonds 146, and insulating layers 126, 130, and 134 have been formed on semiconductor wafer 118. Encapsulant 150 is deposited over the structure 122-146 for structural support during formation of additional interconnect structures.

Figure 4A:
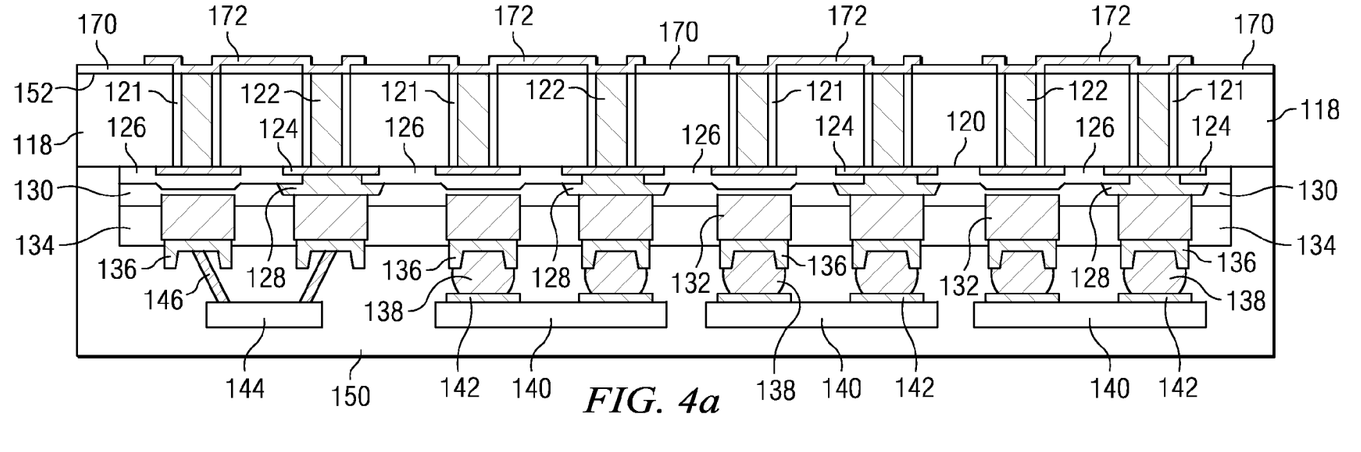
FIGS. 4a-4d illustrate a method of forming an interconnect structure with TSV and backside RDL for 3-D devices using an encapsulant for structural support.

In FIG. 4a, semiconductor wafer 118 is inverted and back surface 152 is reduced in thickness by mechanical grinding, CMP, wet etching, dry etching, plasma etching, or another thinning process. Since semiconductor wafer 118 is covered with encapsulant 150, the structure is sufficiently robust to reduce substrate thickness to less than 300 μm. In one embodiment, the thickness of the substrate is reduced to 10-50 μm. A temporary carrier or tape is not needed because encapsulant 150 provides the support to maintain the structural integrity of the device, even with the reduced substrate thickness.

An insulating or passivation layer 170 is formed over back surface 152 and TSVs 122. The insulating layer 170 can be one or more layers of SiO2, Si3N4, SiON, Ta2O5, Al2O3, or other material having similar insulating properties. The insulating layer 170 is formed using PVD, CVD, printing, spin coating, spray coating, sintering, or thermal oxidation. A portion of insulating layer 170 is removed by an etching process to expose TSVs 122.

An electrically conductive layer 172 is formed over TSVs 122 and insulating layer 170 using PVD, CVD, sputtering, electrolytic plating, electroless plating process, or other suitable metal deposition process. Conductive layer 172 can be one or more layers of Al, Cu, Sn, Ni, Au, Ag, or other suitable electrically conductive material. Conductive layer 172 is a redistribution layer (RDL) in electrical contact with TSVs 122. RDL 172 extends electrical connectivity of TSVs 122.

Figure 4B:
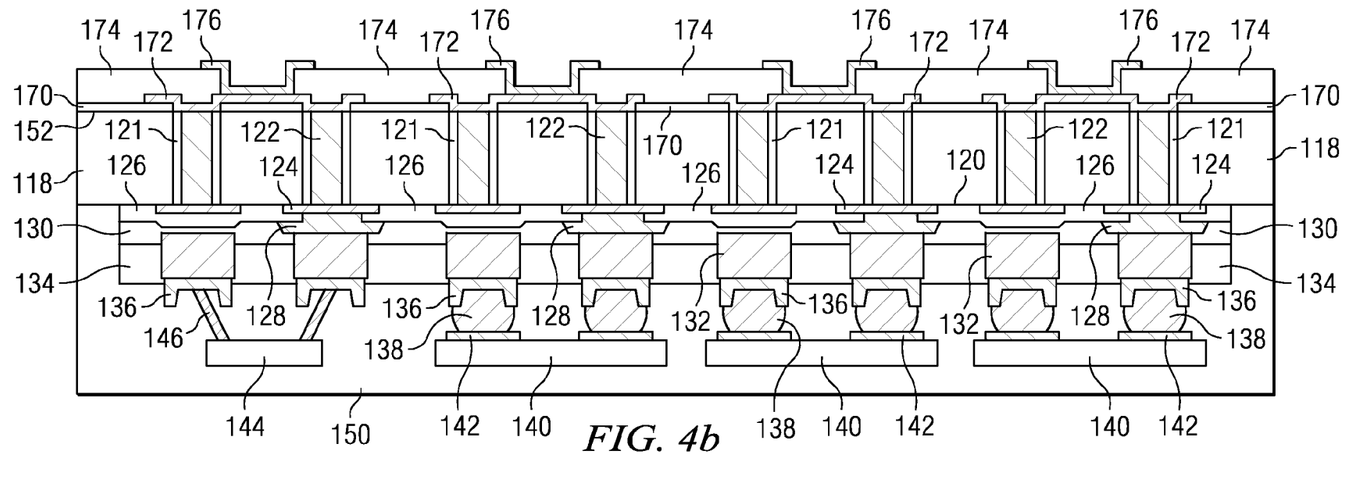

In FIG. 4b, an insulating or passivation layer 174 is formed over insulating layer 170 and RDLs 172. The insulating layer 174 can be one or more layers of SiO2, Si3N4, SiON, Ta2O5, Al2O3, or other material having similar insulating properties. The insulating layer 174 is formed using PVD, CVD, printing, spin coating, spray coating, sintering, or thermal oxidation. A portion of insulating layer 174 is removed by an etching process to expose RDLs 172.

An electrically conductive layer 176 is formed over RDLs 172 and insulating layer 174 using PVD, CVD, sputtering, electrolytic plating, electroless plating process, or other suitable metal deposition process. Conductive layer 176 can be one or more layers of Al, Cu, Sn, Ni, Au, Ag, or other suitable electrically conductive material. Conductive layer 176 is a UBM in electrical contact with RDLs 172.

Figure 4C:
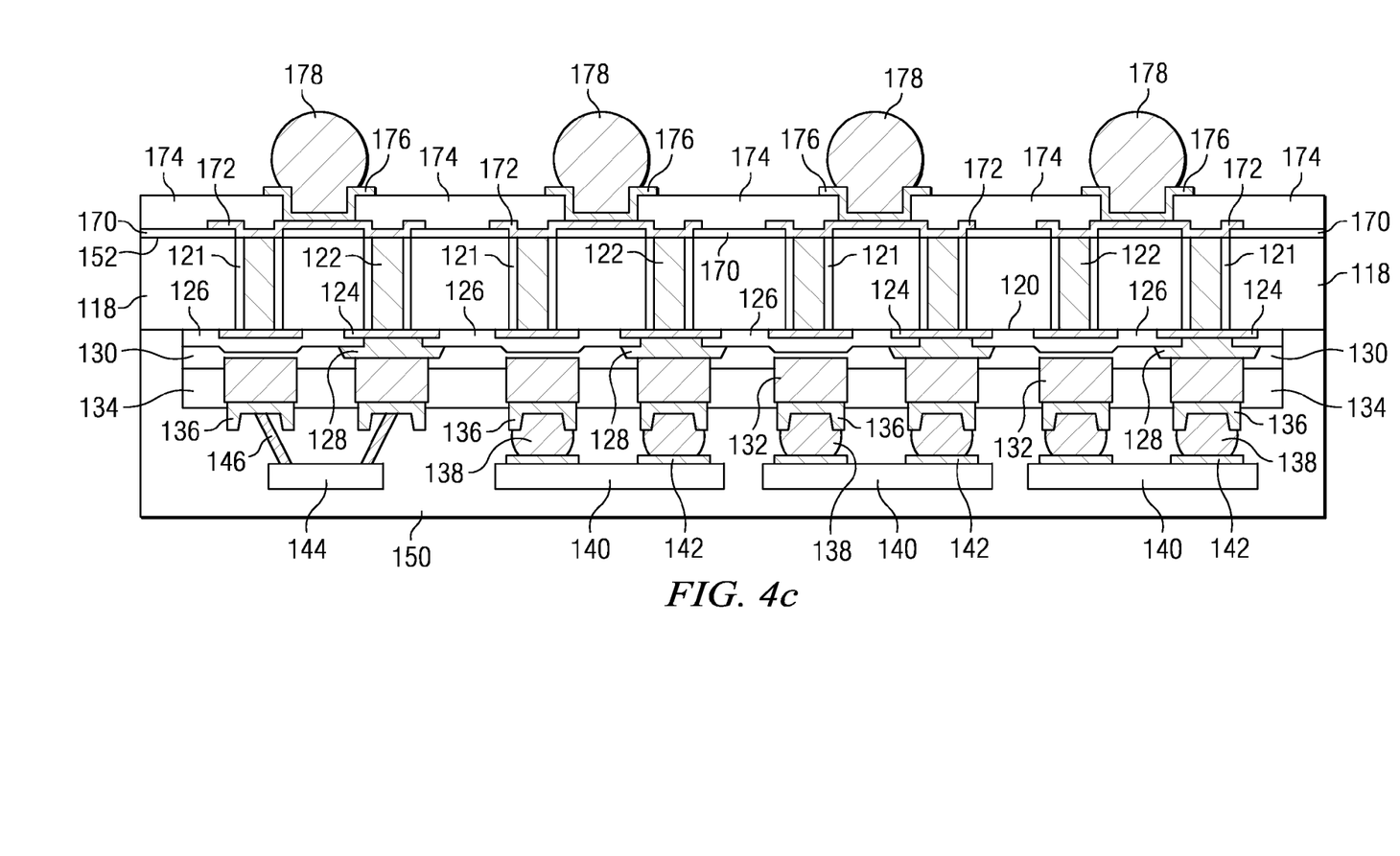

In FIG. 4c, an electrically conductive material is deposited over UBM 176 using an evaporation, electrolytic plating, electroless plating, ball drop, or screen printing process. The conductive material can be Al, Sn, Ni, Au, Ag, Pb, Bi, Cu, solder, and combinations thereof, with an optional flux material. For example, the conductive material can be eutectic Sn/Pb, high-lead solder, or lead-free solder. The conductive material is bonded to UBM 176 using a suitable attachment or bonding process. In one embodiment, the conductive material is reflowed by heating the material above its melting point to form spherical balls or bumps 178. In some applications, bumps 178 are reflowed a second time to improve electrical contact to UBM 176. The bumps can also be compression bonded to UBM 176. Bumps 178 represent one type of interconnect structure that can be formed over UBM 176. The interconnect structure can also use bond wires, conductive paste, stud bump, micro bump, or other electrical interconnect.

Figure 4D:
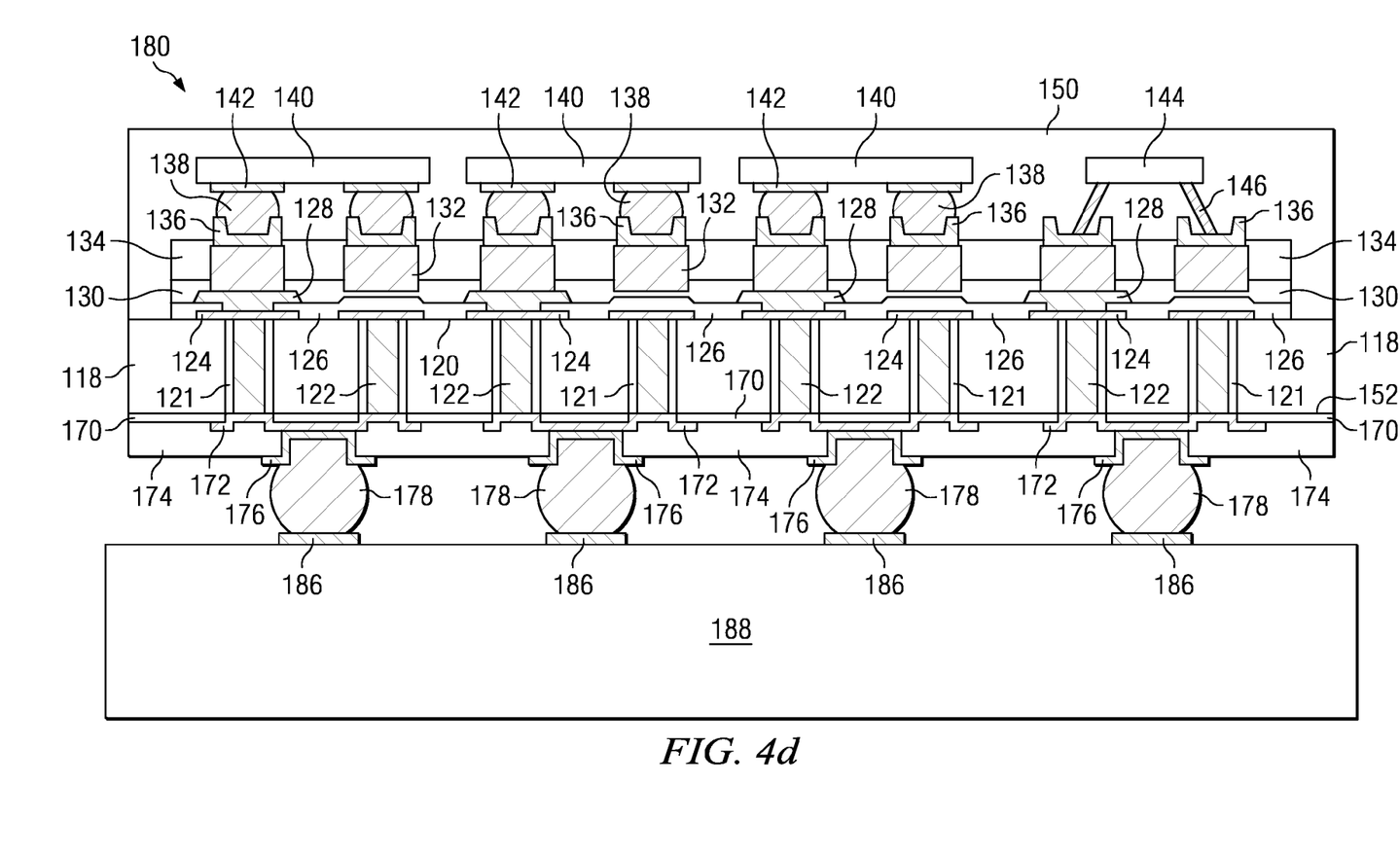

In FIG. 4d, semiconductor wafer 118 is inverted again and singulated into semiconductor devices 180, which are metallurgically and electrically connected to contact pads 186 on PCB 188 using bumps 178. Semiconductor die 140 and passive device 144, as well as passive and active devices in active region 120, electrically connect to PCB 188 through bumps 138 and 158, RDL 172, TSV 122, UBMs 136 and 156, conductive pillars 132, bonds 146, and conductive layers 124 and 128.

The encapsulation process makes the substrate or wafer structurally robust during formation of additional interconnect structures. The encapsulant permits backside grinding to substantially reduce its thickness. The electrical connection to PCB 188 is made on the backside of the wafer with TSVs 122 thus reducing the silicon area and package size and increasing device performance. The encapsulant eliminates the need for bonding & de-bonding to a temporary carrier, lowers manufacturing cost, reduces breakage and slip, simplifies handling, and enables higher processing temperatures. The electrical connection to the PCB on the backside of the substrate reduces silicon area and corresponding package size and thickness.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
   providing a substrate;
   forming a conductive via partially through a first surface of the substrate;
   forming an interconnect structure over the first surface of the substrate;
   disposing a semiconductor component over the interconnect structure;
   depositing an encapsulant over the interconnect structure and the semiconductor component; and
   removing a portion of a second surface of the substrate opposite the first surface.

2. The method of claim 1, further including depositing a conductive paste over the interconnect structure.

3. The method of claim 1, wherein forming the interconnect structure further includes:
   forming a first conductive layer over the conductive via;
   forming a first insulating layer over the first conductive layer;
   forming a second conductive layer over the first insulating layer; and
   forming a second insulating layer over the second conductive layer and first insulating layer.

4. The method of claim 3, wherein forming the interconnect structure further includes:
   forming a conductive pillar over the second conductive layer;
   forming a third insulating layer around the conductive pillar; and
   forming a third conductive layer over the conductive pillar and electrically connected to the semiconductor component.

5. The method of claim 1, wherein a thickness of the substrate is in a range of 10 µm to 50 µm.

6. The method of claim 1, wherein a thickness of the substrate is less than 300 µm.

7. A method of making a semiconductor device, comprising:
   providing a substrate;
   forming a conductive via through the substrate;
   forming an interconnect structure over the substrate;
   disposing a semiconductor die over the interconnect structure; and
   depositing an encapsulant over the semiconductor die.

8. The method of claim 7, further including forming a conductive layer over the conductive via.

9. The method of claim 7, wherein forming the interconnect structure further includes:
   forming a first conductive layer over the conductive via;
   forming a first insulating layer over the first conductive layer;
   forming a second conductive layer over the first insulating layer; and
   forming a second insulating layer over the second conductive layer and first insulating layer.

10. The method of claim 7, further including forming a bump over the conductive via.

11. The method of claim 7, wherein a thickness of the substrate is in a range of 10 µm to 50 µm.

12. The method of claim 7, wherein a thickness of the substrate is less than 300 µm.

13. A method of making a semiconductor device, comprising:
   providing a substrate;
   forming a conductive via through the substrate;
   disposing a semiconductor die over the conductive via; and
   depositing an encapsulant over the semiconductor die.

14. The method of claim 13, further including forming an interconnect structure over the substrate.

15. The method of claim 14, wherein forming the interconnect structure further includes:
   forming a first conductive layer over the conductive via;
   forming a first insulating layer over the first conductive layer;
   forming a second conductive layer over the first insulating layer; and
   forming a second insulating layer over the second conductive layer and first insulating layer.

16. The method of claim 15, wherein forming the interconnect structure further includes:
   forming a conductive pillar over the second conductive layer;
   forming a third insulating layer around the conductive pillar; and
   forming a third conductive layer over the conductive pillar and electrically connected to the semiconductor die.

17. The method of claim 13, wherein a thickness of the substrate is in a range of 10 µm to 50 µm.

18. The method of claim 13, wherein a thickness of the substrate is less than 300 µm.

19. The method of claim 13, further including forming a bump over the conductive via.

20. A semiconductor device, comprising:
   a substrate;
   a conductive via formed through the substrate;
   a semiconductor die disposed over the conductive via; and
   an encapsulant deposited over the semiconductor die.

21. The semiconductor device of claim 20, further including an interconnect structure formed over the substrate with the semiconductor die disposed over the interconnect structure.

22. The semiconductor device of claim 21, wherein the interconnect structure includes:
   a first conductive layer over the conductive via;
   a first insulating layer over the first conductive layer;

a second conductive layer over the first insulating layer; and a second insulating layer over the second conductive layer and first insulating layer.

23. The semiconductor device of claim 22, wherein the interconnect structure further includes:

a conductive pillar over the second conductive layer;

a third insulating layer around the conductive pillar; and a third conductive layer over the conductive pillar and electrically connected to the semiconductor die.

24. The semiconductor device of claim 20, wherein a thickness of the substrate is in a range of 10 μm to 50 μm.

25. The semiconductor device of claim 20, wherein a thickness of the substrate is less than 300 μm.

* * * * *